United States Patent
Gabriel et al.

(10) Patent No.: US 6,933,692 B2
(45) Date of Patent: Aug. 23, 2005

(54) DIAGNOSTIC METHOD FOR AN ELECTRIC DRIVE ASSEMBLY

(75) Inventors: David Crist Gabriel, Royal Oak, MI (US); Feng Liang, Canton, MI (US); Michael W. Degner, Novi, MI (US); Raj Prakash, Canton, MI (US); Venkateswa Anand Sankaran, Farmington Hills, MI (US)

(73) Assignee: Ford Motor Company, Dearborn, MI (US)

( * ) Notice: Subject to any disclaimer, the term of this patent is extended or adjusted under 35 U.S.C. 154(b) by 2 days.

(21) Appl. No.: 10/063,868

(22) Filed: May 21, 2002

(65) Prior Publication Data

US 2003/0218439 A1 Nov. 27, 2003

(51) Int. Cl.[7] .................................................. H02P 7/00
(52) U.S. Cl. ........................ 318/432; 318/434; 318/504
(58) Field of Search ......................... 318/565, 432–434, 318/459, 490, 500, 504; 388/909, 928.1

(56) References Cited

U.S. PATENT DOCUMENTS

| | | | |
|---|---|---|---|
| 3,585,477 A | * | 6/1971 | Shacknow .................. 388/829 |
| 3,919,609 A | * | 11/1975 | Klautschek et al. ........ 318/803 |
| 4,259,620 A | * | 3/1981 | Oates et al. ................. 318/802 |
| 4,910,447 A | * | 3/1990 | Masters ....................... 318/599 |
| 5,343,970 A | | 9/1994 | Severinsky et al. |
| 5,481,168 A | | 1/1996 | Mutoh et al. |
| 5,659,235 A | | 8/1997 | Yamada et al. |
| 5,731,669 A | | 3/1998 | Shimizu et al. |
| 5,875,420 A | * | 2/1999 | Piety et al. .................. 702/182 |
| 5,905,349 A | | 5/1999 | Farkas et al. |
| 5,973,463 A | | 10/1999 | Okuda et al. |
| 6,392,418 B1 | * | 5/2002 | Mir et al. .................... 324/503 |

* cited by examiner

*Primary Examiner*—Bentsu Ro
(74) *Attorney, Agent, or Firm*—Tung & Associates; Carlos L. Hanze

(57) ABSTRACT

A method and an electrical drive assembly 10 which operates in accordance with the method. Particularly, the drive assembly 10 includes a diagnostic portion 18 which compares a voltage signal which is communicated to an electrical machine 28 and a voltage signal which is selected by use of a desired torque command signal 33 and which provides a diagnostic of the electrical drive assembly 10 based upon the comparison, effective to provide a positive indication to a user of the drive assembly.

19 Claims, 1 Drawing Sheet

DIAGNOSTIC METHOD FOR AN ELECTRIC DRIVE ASSEMBLY

BACKGROUND OF INVENTION

1. Field of the Invention

The present invention generally relates to a diagnostic method for determining whether an electric drive assembly is producing a desired amount of torque and to an electric drive assembly which incorporates the method and more particularly, to an electric drive assembly which compares a pair of signals or values in order to determine whether the assembly is producing a desired amount of torque.

2. Background of the Invention

Electric drive assemblies are utilized in a wide variety of applications requiring the selective production of torque. Examples of such applications include, but are not limited to, manufacturing or producing an item or causing selective propulsion. It is desirable to ensure or ascertain whether these electric drive assemblies are desirably providing a required amount of torque.

One strategy to increase the likelihood that a desired amount of torque will be produced by an electric drive assembly includes the use of an electrical current regulator which receives a measured signal which was previously communicated to the electric machine or torque producer and which represents the torque requested of the electric machine. Particularly, the current regulator subtracts this received signal from a second signal which represents the currently desired or commanded torque. The regulator uses this difference or modifier to produce a voltage signal which is used to create a torque control signal which is communicated to the electric machine, effective to cause the electric machine to produce the certain amount of desired torque. The current regulator therefore tends to cause the electric machine to produce a desired amount of torque.

While this strategy does reduce the likelihood of the production of undesired torque, it does not entirely eliminate the possibility of undesired operation. This strategy also does not ensure that such undesired operation will be recognized in a timely manner by an operator or user of the electric drive assembly since the electrical current regulator does not identify, or make known to the user, the nature of the operation of the electric drive assembly.

The present invention allows for a relatively efficient determination to be made of the amount of torque which is produced by an electric drive assembly and for the selective creation of a positive indication or diagnostic feedback signal which is indicative of the operational status of the electric drive assembly, thereby allowing an operator or a user of the electric drive assembly to take some action in the event that the electric drive assembly is producing an undesirable amount of torque.

SUMMARY OF INVENTION

An electric drive assembly is provided having certain features/attributes that overcome some or all of the previously delineated drawbacks of prior drive assemblies.

The present invention provides a method for quickly and efficiently determining whether an electric drive assembly is providing a desired amount of torque.

In addition, an electric drive assembly which selectively produces a certain amount of torque and which further provides a positive indication or a positive feedback signal when the assembly is producing torque in an undesired manner is provided.

According to the teachings of one non-limiting embodiment of the present invention, an electric drive assembly is provided. Particularly, the electric drive assembly includes a torque generator; an inverter assembly which is coupled to the torque generator; a current regulator which is coupled to the inverter assembly; and a controller which is coupled to the current regulator, wherein the controller receives a torque request signal and, in response to the received torque request signal, the controller selects a certain value and generates a signal to the inverter assembly which is effective to cause the inverter assembly to produce a voltage signal having a certain amplitude attribute and a certain phase angle attribute, the controller further compares at least one of the attributes of the voltage signal with the selected certain value and, based upon the comparison, generates a signal indicative of an existence of undesired torque generation.

According to the teachings of a second non-limiting embodiment of the present invention, an electric drive assembly is provided and includes a torque map portion which receives a certain torque request and which uses the certain torque request to produce a certain electrical current value; a model portion which receives the certain torque request and which uses the received torque request to produce a certain voltage value; a current regulator which receives an electrical current signal having a value which is substantially similar to the electrical current value and which, in response to the receipt of the certain electrical current signal, produces a second voltage signal having a certain second value; and a diagnostic portion which is coupled to the current regulator and to the model portion and which compares the certain voltage value with the second voltage value and which determines the existence of a predetermined state of operation based upon the comparison.

According to a third non-limiting aspect of the present invention, a method for determining the existence of a certain state of operation of an electric drive assembly of the type which receives a certain torque request and which uses the received certain torque request to produce a voltage command is provided. Particularly, the method includes the steps of associating the torque request with a second voltage command; comparing the produced voltage command with the second voltage command; ascertaining the existence of a certain operational state of the electric drive assembly based upon said comparison; and automatically deactivating the electric drive assembly upon the ascertained existence of the certain operational state.

These and other features and advantages of the present invention will become apparent from a reading of the following detailed description of the preferred embodiment of the invention and by reference to the following drawings.

DETAILED DESCRIPTION

Figure 1:
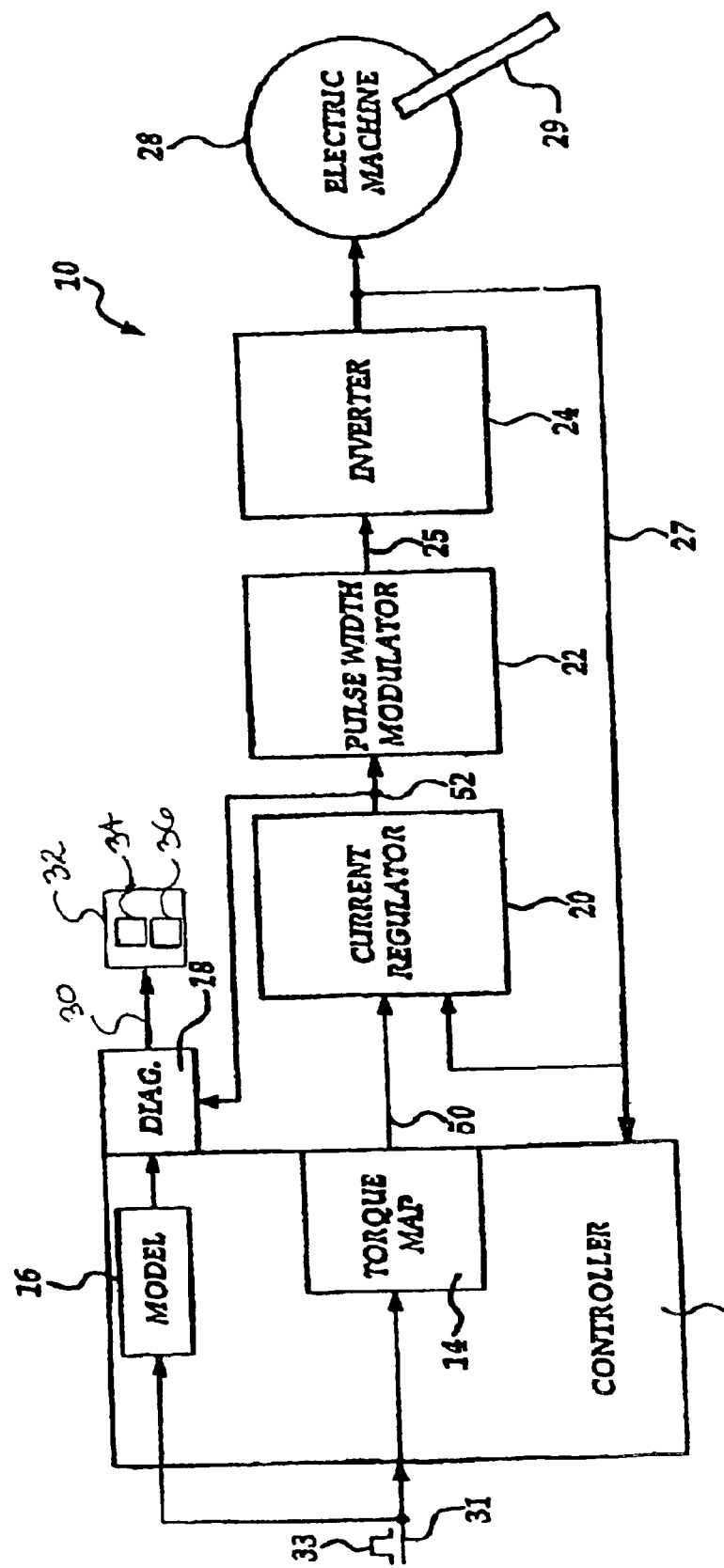
FIG. 1 is a block diagram of an electric drive assembly which is made in accordance with the teachings of the preferred embodiment of the invention.

Referring now to FIG. 1, there is shown an electric drive assembly 10 which is made in accordance with the teachings of the preferred embodiment of the invention. Particularly, the electric drive assembly 10 includes a controller 12 which is operable under stored program control and which may comprise, by way of example and without limitation, a commercially available processor assembly. The controller 12 includes a torque map portion 14, a model portion 16, and a check or consistency/diagnostic portion 18. It should be appreciated that each of these portions 14, 16, 18 may be implemented within software and may be operatively resident within the controller 12 and that, in one non-limiting embodiment, portion 18 may reside outside of the controller 12. It should be further appreciated that the controller 12 may be physically and communicatively coupled to a source of energy (not shown) and is effective, according to the methodology of the invention, to selectively cause the energy source to output energy along output bus 50.

The electric drive assembly 10 further includes an electrical current regulator 20, a pulse width modulator or modulation assembly 22, an inverter 24 which is coupled to the pulse width modulation assembly 22, by bus 25, and an electric machine or torque producer 28 which is coupled to the inverter 24 and to the controller 12 by bus 27. The machine 28 includes a selectively movable shaft or member 29 and, in one non-limiting embodiment of the invention, may comprise a conventional motor assembly. Portions 14 and 16 are communicatively coupled to the input bus 31 and inverter 24 and pulse width modulation assembly 22 may cooperatively compromise an "inverter assembly".

Particularly, in operation, member 29 selectively rotates, thereby producing torque, when the electric machine 28 receives electrical power or is energized or activated by the receipt of electrical energy which is communicated to the electrical machine 28 by use of the bus 27. As is shown, the electrical current regulator 20 is physically and communicatively coupled to the pulse width modulator 22 by bus 52 and is physically and communicatively coupled to the controller 12 by the bus 50. The controller 12 is further adapted to receive a torque request signal 33 by use of the bus 31 and is physically and electrically coupled to the bus 52 through the diagnostic or feedback signal generation portion 18. In one non-limiting embodiment of the invention, assembly 10 may not include the machine 28, but rather is selectively operable and attachable to a variety of torque producing machines.

Particularly, the torque map portion 14 comprises a table which uniquely associates desired or requested amounts of torque, such as and without limitation the amount of torque represented by signal 33 which appears on bus 31, with a certain respective amount of electrical current needed by (e.g., needed to be communicated to) the electric machine 28 to produce these respective desired amounts of torque (e.g., each stored desired amount of torque has a respective amount of electrical current which is uniquely associated with it). In one non-limiting embodiment, this table may be created by testing or calibrating the electric machine 28. A received torque command signal 33 having a torque value which is not resident within the torque map table is used to select an electrical current value by the mathematical process of interpolation. That is, the electrical current values associated with the nearest higher and lower actually stored torque values are used to interpolatively select an electrical current value for the received signal 33. Alternatively, the stored torque value which is "nearest" to the value of the input torque signal 33 is selected in the torque map portion 14 and the associated electrical current value of this selected and stored torque value is used in the methodology which is delineated below.

The model portion 16 comprises a table which uniquely associates desired or requested amounts of torque, such as and without limitation the amount of torque represented by signal 33, with a certain respective amount of voltage which is required to be output from the current regulator 20 in order to allow the electrical machine 28 to produce the respective desired amounts of torque (e.g., each stored desired amount of torque has a respective amount of voltage which is uniquely associated with it). In one non-limiting embodiment, this table may be created by testing or calibrating the current regulator 20 and the electric machine 28. A torque request signal, such as that represented by signal 33, having a value which is not resident within the model portion 16, is used to select a voltage signal by the mathematical process of interpolation. That is, the voltage values associated with nearest higher and lower actually stored torque values are used to interpolatively select a voltage value for the received signal 33. Alternatively, the stored torque value which is "nearest" to the value of the input torque signal 33 is selected in the model portion 16 and the associated voltage of the selected and stored torque value is used in the methodology which is delineated below.

In operation, the signal 33 which specifies a certain amount of desired torque is input and communicated to the controller 12 by a user or operator of the electric drive assembly 10. The input signal 33 is then used by the controller 12 to access the torque map portion 14, thereby selecting a certain amount or value of electrical current which is necessary to be communicated to the electrical machine 28, by the use of bus 27, to cause the electrical machine 28 to produce the desired amount of torque. The torque request signal is also input into the model portion 16 and the model portion 16 uses the received torque request signal 33 to select a voltage value and/or generate a voltage signal having this value which is required to be output from the current regulator 20, necessary to cause the desired amount of torque to be produced.

A current signal having a value which is equal to the current value selected from the torque map portion 14 is then provided from the energy source (not shown) and may be communicated to the current regulator 20, by use of bus 50. The current regulator 20 then uses the received electrical current signal to produce a voltage signal and communicates the voltage signal to the pulse width modulator 22 by the use of bus 52. The pulse width modulator 22 then modulates the received voltage signal and communicates the modulated voltage signal to the inverter 24, by the use of bus 25.

The inverter 24 then applies the received voltage signal to the electrical machine 28, by the use of bus 27, thereby producing an electrical current signal, effective to cause the electrical machine 28 to produce a desired amount of torque. The electrical current signal, which is output from the inverter 24, is also communicated to the current regulator 20, by the bus 27, thereby allowing the current regulator 20 to ensure that the next received electrical current signal is modified by this signal, thereby efficiently correcting for any undesired torque production from the electric machine 28. Additionally, the voltage signal which is produced by the current regulator 20 is communicated to the diagnostic portion 18, by the use of bus 52, where its value is compared with the voltage value which was identified/produced from the model portion 16. Should these compared voltage values differ by at least a certain amount, a diagnostic signal 30 is generated by the controller 12 to a selectively energizable or activatable positive feed back assembly 32, effective to activate the positive feedback assembly and to notify an operator or use of the assembly 10 that a certain operational state (e.g., a state in which an undesired amount of torque is being produced) is occurring within the assembly 10. Examples of such a positive feed back assembly 32 may include, by way of example and without limitation, a selectively energizable light assembly 34 and/or a selectively energizable audio assembly 36. Additionally or alternatively, controller 12 may also automatically (i.e., without use intervention) deactivate the electric machine 28 when the assembly 10 resides in such an operational state. In one non-limiting embodiment, this certain amount exists where the difference between the voltage value identified from the model portion 16 and the voltage value of the signal produced by the current regulator 20 is equal to about 10% of the value identified or selected by the model portion 16. Other threshold values may be alternatively used. In this manner, the user is given a positive indication of the production of an undesirable amount of torque from the machine 28 and the electric machine 28 may be automatically (e.g., without user intervention) deactivated. One non-limiting method which may be used to automatically deactivate the electric machine 28 is to cause the controller 22 to prevent electrical energy from being delivered to the electric machine 28 by the use of bus 50.

It is to be understood that the present invention is not limited to the exact construction or method which has been delineated above, but that various changes and modifications may be made without departing from the spirit and the scope of the inventions as are further delineated within the following claims. Further, in other non-limiting embodiments, the data which is resident within the model portion 16 may alternatively comprises voltage phase angle type data and the data which is obtained from the current regulator 20 and communicated to the model portion 16 may also alternatively comprise voltage angle data. Further, in yet another non-limiting embodiment, the controller 12 may ascertain the production of an undesired amount of torque by identifying certain undesired harmonic components or a certain amount of imbalance of the assembly 18 (e.g., by the use of vibration sensors (not shown)), thereby obviating the need for the model portion 16. In this non-limiting "unbalance detection" embodiment, the torque map portion 14 may still be utilized in order to determine the current command required for the current regulator 20.

What is claimed is:

1. An electric drive assembly comprising a torque generator; an inverter assembly which is coupled to said torque generator; a current regulator which is coupled to said inverter assembly; and a controller which is couple to said current regulator, said controller received a torque request signal and, in response to said received torque request signal, said controller selects a certain value and grnerates a signal to said inverter assembly which is effective to cause said inverter assembly to produce a voltage signal having a certain amplitude attribute and a certain phase angle attribute, said controller further compares at least one of said attributes of said voltage signal with said selected certain value and, based upon said comparison, generates a signal indicative of undesired torque generation.

2. The electric drive assembly of claim 1 wherein said certain value comprises a voltage value.

3. The electric drive assembly of claim 1 wherein said certain value comprises a phase angle value.

4. The electric drive assembly of claim 1 wherein said electric drive assembly comprises a positive feedback assembly which is coupled to said controller and which is selectively activated by said signal indicative of undesired torque generation which is generated by said controller.

5. The electric drive assembly of claim 4 wherein said signal indicative of undesired torque generation is generated by said controller only when the difference between said at least one attribute of said voltage signal and said selected certain value is greater than a predetermined value.

6. The electric drive assembly of claim 5 wherein said predetermined value is about ten percent of said selected certain value.

7. The electric drive assembly of claim 4 wherein said positive feedback assembly comprises an audio assembly.

8. The electric drive assembly of claim 4 wherein said positive feedback assembly comprises a light assembly.

9. An electric drive assembly comprising a torque map portion which receives a predetermined torque request and which uses said predetermined torque request to produce a predetermined electrical current value; a model portion which receives said predetermined torque request and which uses said predetermined torque request to produce a predetermined voltage value; a current regulator which receives an electrical current signal having a value which is substantially similar to said predetermined electrical current valve and which, in response to said receipt of said electrical current signal, produces a second voltage signal having a predetermined second voltage value; and a diagnostic portion which is coupled to said current regulator and to said model portion and which compares said predetermined voltage value with said predetermined second voltage value, and which determines the existence of a certain condition based upon said comparison.

10. The electric drive assembly of claim 9 wherein said certain condition is determined to exist only if the difference between said predetermined voltage value and said predetermined second voltage value exceeds a certain condition threshold value.

11. The electric drive assembly of claim 10 wherein said certain condition threshold value is about 10% of said predetermined voltage value.

12. The electric drive assembly of claim 11 wherein said diagnostic portion provides a signal indicative of an undesired condition to a positive feedback assembly.

13. The electric drive assembly of claim 12 wherein said positive feedback assembly comprises a light assembly.

14. The electric drive assembly of claim 12 wherein said positive feedback assembly comprises an audio assembly.

15. The electric drive assembly of claim 12 further comprises a selectively activatable machine and wherein said diagnostic portion deactivates said machine upon the detection of said certain condition.

16. The method
providing an electric drive assembly having a torque generator, an inverter assembly which is coupled to said torque generator, a current regulator which is coupled to said inverter assembly, and a controller which is coupled to said current regulator;
receiving a torque request signal;
using said controller to select a certain value associated with said torque request signal; and using said controller to generate said signal indicative of undesired torque generation;
producing a voltage signal having a certain amplitude attribute and a certain phase angle attribute in response to said received torque request signal;
comparing at least one of said attributes of said voltage signal with a selected certain value; and
generating a signal indicative of undesired torque generation when an undesired amount of torque is being produced by said electric drive assembly.

17. The method of claim 16 further comprising the step of:
selectively activating a positive feedback assembly when said signal indicative of undesired torque generation is generated by said controller.

18. The method of claim 17 further comprising the step of:

generating said signal indicative of undesired torque generation only when the difference between said at least one attribute of said voltage signal and said selected certain value is greater than a predetermined value.

19. A method for controlling an electric drive assembly comprising the steps of providing an electric drive assembly having a torque map portion, a model portion, a current regulator, and a diagnostic portion;

receiving a predetermined torque request in said torque map portion;

using said predetermined torque request to produce a predetermined electrical current value;

receiving said torque request in said model portion;

using said predetermined torque request to produce a predetermined voltage value;

providing a current regulator which receives an electrical current signal having a value which is substantially similar to said predetermined electrical current value;

producing a second voltage signal having a predetermined second voltage value;

comparing said predetermined voltage value with said predetermined second voltage value and determining an existence of a certain condition based upon said comparison.

* * * * *